United States Patent
Makiura

(10) Patent No.: US 7,621,793 B2
(45) Date of Patent: Nov. 24, 2009

(54) ORGANIC ELECTRO LUMINESCENT DEVICE AND METHOD OF MANUFACTURING ORGANIC ELECTRO LUMINESCENT DEVICE

(75) Inventor: Rie Makiura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 410 days.

(21) Appl. No.: 11/391,280

(22) Filed: Mar. 29, 2006

(65) Prior Publication Data
US 2006/0220543 A1 Oct. 5, 2006

(30) Foreign Application Priority Data

| Mar. 30, 2005 | (JP) | 2005-100112 |
| Mar. 30, 2005 | (JP) | 2005-100113 |
| Mar. 28, 2006 | (JP) | 2006-088286 |

(51) Int. Cl.
*H01J 9/24* (2006.01)

(52) U.S. Cl. .................................... 445/24; 313/504

(58) Field of Classification Search .............. 445/24, 445/50; 313/504, 498
See application file for complete search history.

(56) References Cited

U.S. PATENT DOCUMENTS

| 6,188,176 B1 * | 2/2001 | Nakaya et al. ............ 313/504 |
| 6,208,077 B1 * | 3/2001 | Hung ........................ 313/506 |
| 6,456,003 B1 * | 9/2002 | Mori et al. ................. 313/504 |
| 6,614,176 B2 * | 9/2003 | Kim et al. .................. 313/506 |
| 6,784,016 B2 * | 8/2004 | Long et al. ................. 438/99 |
| 6,811,897 B2 * | 11/2004 | Naito et al. ................ 428/690 |
| 7,199,516 B2 | 4/2007 | Seo et al. |
| 7,301,279 B2 | 11/2007 | Sakakura et al. |
| 2007/0200491 A1 | 8/2007 | Seo et al. |
| 2008/0079359 A1 | 4/2008 | Sakakura et al. |

FOREIGN PATENT DOCUMENTS

| JP | A 9-187137 | 7/1997 |
| JP | A 2000-150171 | 5/2000 |
| JP | 2000-156291 A | 6/2000 |
| JP | A-2002-289344 | 10/2002 |
| JP | 2004-145244 A | 5/2004 |
| WO | WO 03/055275 A1 | 7/2003 |
| WO | WO 2005/021678 A2 | 3/2005 |

OTHER PUBLICATIONS

Burroughes, J.H. et al. "Light-emitting diodes based on conjugated polymers." Nature, 347,539 (1990).

* cited by examiner

*Primary Examiner*—Toan Ton
*Assistant Examiner*—Hana A Sanei
(74) *Attorney, Agent, or Firm*—Oliff & Berridge PLC

(57) ABSTRACT

A method of manufacturing an organic EL device provided at least with a light emitting layer between a first electrode and a second electrode disposed above a base member, includes a first step of forming a buffer layer above the first electrode, and at least a part of the buffer layer is formed by a plasma polymerization method in the first step.

13 Claims, 8 Drawing Sheets

ORGANIC ELECTRO LUMINESCENT DEVICE AND METHOD OF MANUFACTURING ORGANIC ELECTRO LUMINESCENT DEVICE

BACKGROUND OF THE INVENTION

1. Technical Field

The present invention relates to an electro-optic device such as an organic electro luminescent (EL) device and a method of manufacturing the device.

2. Related Art

In general, an organic EL element included in an organic EL device has a structure having a thin film of a light emitting organic material formed between an anode and a cathode. And it is understood that electrons and positive holes injected from the both electrodes are recombined in the light emitting layer to discharge the excited energy as emission of light.

In such an organic EL element, in order for forming a film of an organic material such as a light emitting layer or a carrier transport layer, a vacuum evaporation method or a coating method is mainly adopted.

In the evaporation method, the masked vacuum evaporation method is used for fine patterning, but because of the problem of the mask distortion, it is allegedly difficult in general to obtain high patterning accuracy in manufacturing large-screen displays.

Meanwhile in the coating method, for example, an inkjet method for selectively ejecting droplets is used for fine patterning, which can be applied to manufacturing the large-screen display with relative ease. Further, since the material is disposed only to necessary portions, improvement in efficiency of material use can also be expected.

Note that the organic EL element manufactured by the coating method is reported in, for example, J. H. Burroughs, D. D. C., Bradley, A. R. Brown, R. N. Marks, R. H. Friend, P. L. Burns, A. B., Holmes, Nature, 347, 539 (1990).

In general, it is known in the organic EL element that element characteristics such as quantum efficiency in light emission or life can be improved by forming a carrier injection layer or a carrier transport layer between the light emitting layer for emitting light and the electrode.

For example, JP-A-10-92584 (Application Number: Hei-9-187137) reports that the element characteristics can be improved by inserting the conductive polymer composed of PEDOT/PSS (polyethelenedioxithiophene/polystyrene-sulfonic-acid) between ITO and the light emitting layer as a hole injection layer.

However, the carrier injection layer and the carrier transport layer might cause degradation in the emission efficiency or the life. For example, in the case in which the PEDOT/PSS is utilized as the material of the hole injection layer, the problem of degradation in the emission efficiency and the life caused by dispersion of chemical species in the light emitting layer has arisen. Further, the problem has also arisen that imbalance between transferring speeds of electron and positive hole increases probability of collision between electron and positive hole in other areas than the light emitting layer to increase the ineffective current, thus degrading the emission efficiency.

SUMMARY

The invention mainly addresses the problems described above.

A method of manufacturing an organic EL device according to the invention is a method of manufacturing an organic EL device, which is provided at least with a light emitting layer between a first electrode and a second electrode disposed above a base member, and includes a first step of forming a buffer layer above the first electrode, and, in the first step, at least a part of the buffer layer is formed by a plasma polymerization method.

By using the plasma polymerization method in the method of manufacturing an organic EL device described above, a dense and preferable film can be obtained. Thus, for example, dispersion of chemical species, which are the factors for degrading the light emitting layer and included in the first electrode, to the light emitting layer can be suppressed.

Further, in the case in which a carrier injection layer or a carrier transport layer is disposed between the first electrode and the buffer layer, chemical species, which are the factors for degrading the light emitting layer and included in the carrier injection layer or the carrier transport layer, to the light emitting layer can also be suppressed.

Still further, an advantage of suppressing movement of excitons generated in the light emitting layer and carriers injected from the second electrode towards the first electrode can also be expected.

Note that the first electrode can be, for example, a pixel electrode, an anode, or a cathode.

In the method of manufacturing an organic EL device described above, a material including fluorine can be used in the plasma polymerization method.

As the material described above, for example, a fluorocarbon compound including a carbon-fluorine bond is preferable. A film obtained by using a chemical compound including the carbon-fluorine bond has characteristics of strong solvent resistance and decay resistance.

Therefore, after forming the buffer layer, even if a functional layer such as the light emitting layer is stacked on the buffer layer by a droplet ejecting method such as an inkjet method, damages to the layers below the buffer layer can be minimized.

Further, after forming the buffer layer, even if a functional layer such as the light emitting layer is formed as a film by a vapor deposition method, damages to the layers below the buffer layer can also be minimized.

Note that as the material described above, those including elements such as hydrogen or nitrogen can also be used.

The method of manufacturing an organic EL device described above can further include a second step of forming a hole injection layer on the first electrode, and the first step can be executed after the second step is executed.

The hole injection layer can include a polymeric compound including ethylenedioxythiophene.

Further, the hole injection layer can be PEDOT/PSS.

The hole injection layer is disposed between the light emitting layer and the first electrode. Thus, the hole injection efficiency can be improved or the most appropriate hole transfer rate in accordance with the electron transfer rate can be set.

In the case in which some chemical species causing degradation of the characteristics such as a degradation factor of the light emitting layer are included in the hole injection layer, the buffer layer can suppress dispersion or infiltration of such chemical species to the light emitting layer.

Alternatively, it becomes possible to suppress the dispersion of the excitons generated in the light emitting layer to the first electrode side or penetration of the electrons injected from the second electrode to the first electrode. In the method of manufacturing an organic EL device described above, the hole injection layer can be in contact with the buffer layer.

Thus, in the case in which some chemical species causing degradation of the characteristics such as a degradation factor of the light emitting layer are included in the hole injection layer, for example, the buffer layer can efficiently suppress the dispersion or the infiltration of such chemical species to the light emitting layer.

Further, an advantage of repairing a capturing site of carriers or excitons such as a structural defect caused in the surface of the hole injection layer can also be expected.

In the method of manufacturing an organic EL device described above, the light emitting layer is preferably disposed above the base member, a bank for partitioning the light emitting layer is preferably provided, and the buffer layer is preferably provided also above the bank.

The method of manufacturing an organic EL device described above provides remarkable advantages particularly in the case in which the second electrode is disposed above the bank.

Namely, the advantage that the buffer layer can suppress dispersion of chemical species, which are included in the second electrode and become degradation factors for the functional layer such as the light emitting layer or an active element such as a transistor for driving the organic EL element, can be expected.

In the method of manufacturing an organic EL device described above, the buffer layer is preferably formed so as to be in contact with the first electrode in the first step, and an average thickness of the buffer layer is preferably arranged to be greater than 15 Å and smaller than 200 Å providing average asperity (Ra) of a surface of the first electrode is equal to or greater than 15 Å.

In particular in the case in which the thickness of the buffer layer is equal to or less than 10 Å in average, there might be formed an area where the first electrode and the light emitting layer are in direct contact with each other, and accordingly, degradation of the element might be induced.

In the method of manufacturing an organic EL device described above, the average thickness of the buffer layer can be equal to or less than 200 Å.

In particular, in the case in which the buffer layer and the first electrode are contiguous with each other, the buffer layer with the average thickness of no greater than 200 Å can provide appropriate electrical conductivity.

In the method of manufacturing an organic EL device described above, the average thickness of the buffer layer can be equal to or less than 60 Å.

Particularly in the case in which a carrier injection layer such as the hole injection layer or a carrier transport layer such as a hole transport layer is disposed between the buffer layer and the first electrode, the average thickness of the buffer layer is preferably no greater than 60 Å in order for obtaining appropriate electrical conductivity.

In the method of manufacturing an organic EL device described above, the buffer layer can be in contact with the second electrode.

The method of manufacturing an organic EL device described above can further include a third step of forming the second electrode on the buffer layer, and the buffer layer and the second electrode can be in contact with each other.

Since the buffer layer is in contact with the second electrode, the dispersion and the infiltration of chemical species, which are included in the second electrode and become the degradation factors of the organic EL device, can be suppressed.

Further, in the case in which the organic EL element is driven by an active element such as a transistor, the substances included in the second electrode might become movable ions to degrade the active element. However, by arranging the second electrode and the buffer layer to be in contact with each other, the advantage of suppressing dispersion or infiltration of the movable ions can also be expected.

In the method of manufacturing an organic EL device described above, an average thickness of the buffer layer may be equal to or less than 30 Å.

In the method of manufacturing an organic EL device described above, it is preferable that the buffer layer entirely covers the hole injection layer.

Thus, in the case in which some chemical species causing degradation of the characteristics such as a degradation factor of the light emitting layer are included in the hole injection layer, for example, the buffer layer can more efficiently suppress the dispersion or the infiltration of such chemical species to the light emitting layer.

In the method of manufacturing an organic EL device described above, a first film forming the bank can cover a part of the first electrode, and at least a part of the first film can overlap a part of the buffer layer.

Thus, the edge section of the first electrode, the carrier injection layer, of the carrier transport layer can also be covered with the buffer layer, the advantage of suppressing the dispersion of the infiltration of the degradation factors of the organic EL element derived from the first electrode, the carrier injection layer, or the carrier transport layer can be expected.

Note that the first film can correspond, for example, a inorganic bank 13 explained later.

In the method of manufacturing an organic EL device described above, the first film can be made of an inorganic material. As the inorganic material, for example, silicon oxide, silicon nitride, and silicon oxynitride can be cited.

An organic EL device according to the invention includes a first electrode disposed above a base member, a second electrode disposed above the base member, a light emitting layer disposed between the first electrode and the second electrode, and an insulating film disposed between the light emitting layer and the first electrode.

The light emitting layer of the organic EL device is preferable to be formed by a liquid process such as an inkjet method and a spin-coating method.

The insulating film can be a member having a function similar to the buffer layer in the method of manufacturing an organic EL device described above. For example, it is preferably a member for suppressing the dispersion of the chemical species, which are included in the first electrode and become the degradation factors of the light emitting layer, to the light emitting layer. Or, in the case in which the carrier injection layer of the carrier transport layer is disposed between the first electrode and the buffer layer, it is preferably a member for suppressing the dispersion of the chemical species, which are included in the carrier injection layer of the carrier transport layer and become the degradation factors of the light emitting layer, to the light emitting layer.

As a method of forming the insulating layer, for example, a coating method, a vapor deposition method, a CVD method and so on can appropriately be used. By using the plasma polymerization method as described above, a dense and highly durable film can be formed.

The insulating film can also be provided above the bank partitioning the light emitting layer or the first electrode.

BRIEF DESCRIPTION OF THE DRAWINGS

The invention will now be described with reference to the accompanying drawings, wherein like numbers refer to like elements.

DESCRIPTION OF THE EMBODIMENTS

Figure 1:
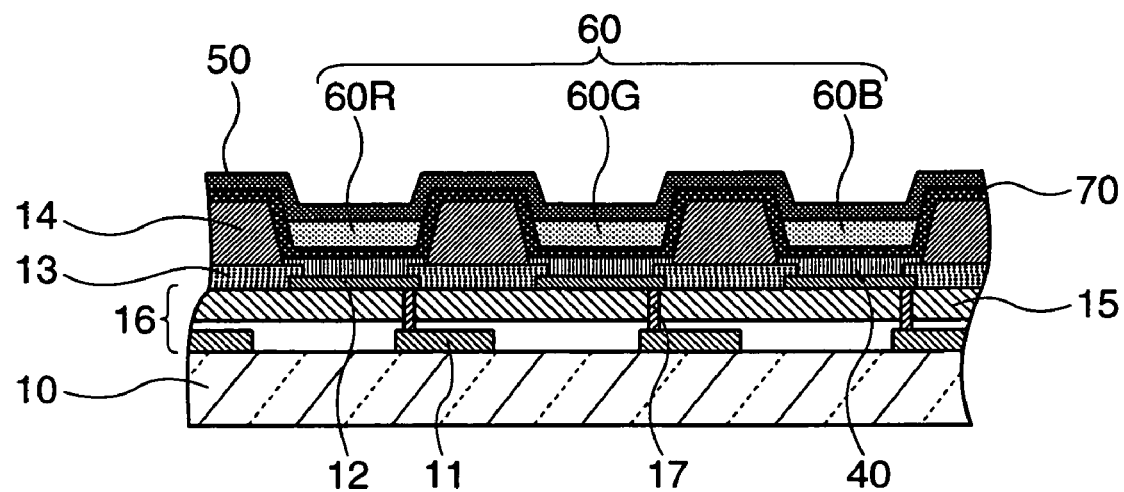
FIG. 1 is a cross-sectional view for explaining an organic EL device of a first embodiment according to the invention.

The invention will hereinafter be explained in detail. Note that these embodiments show some aspects of the invention, but do not limit the scope of the invention, and can freely be modified within the scope of the invention. Further, the scale ratios of the various layers and the various members may be set differently in the drawings shown below in order for illustrating the various layers and the various members in visible sizes on the drawings.

Hereinafter, embodiments of the invention will be described with reference to the accompanying drawings. Note that the embodiments in which the organic EL device is used as the display device are described.

Organic EL Device of First Embodiment According to the Invention

In a method of manufacturing an organic EL device by an inkjet method, for example, an organic EL element is formed by ejecting an ink composition from an inkjet head to be applied on an electrode. The ink composition contains a light emitting material, a carrier injection material, or a carrier transport material for forming pixels, composed of an organic matter, and dissolved or dispersed with a solvent. By providing a partition (hereinafter referred to as a bank) for partitioning the pixel areas or the electrodes for coating predetermined pixel areas with the ejected ink droplets with good accuracy, the light emitting layer, the carrier injection layer, and the carrier transfer layer can be disposed in accordance with the pixels with better accuracy.

Substrate

FIG. 1 shows a cross-sectional view of the organic EL device of the first embodiment according to the invention. A circuit element section 16 including thin film transistors (TFTs) 11 and an insulating layer 15 is formed on a glass substrate 10, and patterned anodes 12 are disposed on the circuit element section 16. The TFT 11 and anode 12 are connected to each other via wiring 17 provided through the insulating layer 15.

The organic EL device is configured by further including inorganic banks 13 made of $SiO_2$ or the like for partitioning the anodes 12 and organic banks 14 disposed on the inorganic banks 13. The shape of the bank, namely the opening shape of the pixel can be either one of circle, ellipse, or rectangle. However, since the ink composition has certain surface tension, the corners of a rectangle are preferably rounded. The material to be used for the organic bank 14 can appropriately be selected in accordance with the desired function, but preferably has insulating property, heat resistance, or adhesiveness with the inorganic bank 13, in general. In the case in which the droplet ejecting method such as the inkjet method is used for forming a functional layer such as a light emitting layer, the material is desired to have lyophobicity or resistance to the ink solvent. The banks are not particularly limited to those having layered structures as described above, but are preferably provided with the inorganic banks 13 for improving the adhesiveness with ITO if, for example, the anodes are made of ITO. The thickness of the organic bank 14 is appropriately selected in consideration of the thickness of the functional layer such as a light emitting layer, an amount of ejected droplets, and so on, and is set in a range of about 1 through 2 μm in the present embodiment.

Anode

Since the anode 12 is formed of a transparent electrically conductive material in the present embodiment, it can be used as a so-called bottom emission type of organic EL device in which the light emitted from the light emitting layer 60 is taken out from the glass substrate side. Although ITO is preferable as the transparent electrically conductive material, other materials such as indium oxide/zinc oxide amorphous transparent electrically conductive film (Indium Zinc Oxide: IZO (registered trademark)) (produced by Idemitsu Kosan Co. Ltd.) or the like can also be used. Note that ITO is assumed to be used in the present embodiment. Note also that if the anode 12 is formed as a transparent electrode, a so-called top emission type of organic EL device, in which the light emitted by the light emitting layer 60 is taken from the cathode 70 side, can be configured by disposing an aluminum film in the lower layer.

Hole Injection Layer

As a material for forming the hole injection layer 40, in particular, dispersion liquid of 3,4-polyethelene-dioxithiophene/polystyrene-sulfonic-acid (PEDOT/PSS) (Product mane: Bytron-p, produced by Bayer Material Science AG), which is dispersion liquid made by dispersing 3,4-polyethelenedioxithiophene in polystyrene-sulfonic-acid and then further dispersed in a polar solvent such as water or isopropyl alcohol, is preferably used.

Buffer Layer

In forming a buffer layer 70, it is desirable that a plasma polymerization method using a gaseous material is used. Thus, a dense and highly durable polymer film can be formed.

The material used for the plasma polymerization method can appropriately be selected in consideration of desired film properties and so on. For example, if the buffer layer 70 needs to suppress infiltration or dispersion of chemical species such as ions with high polarity, the buffer layer 70 is preferably formed as nonpolar. In such a case, a typical hydrocarbon compound such as methane, ethylene, or ethane can be used as the material for the plasma polymerization.

Further, if it needs to suppress scattering of carriers or excitons, a material for forming an insulating film such as alkoxysilanes, which are precursors of inorganic insulating materials such as silicon oxide, can also be used besides the hydrocarbon compounds described above.

If a functional layer such as a light emitting layer is formed on the buffer layer 70 using a coating method, wettability of the buffer layer 70 can be considered. In the case in which a polymer film with strong lyophobicity is formed, those including fluorocarbon, namely carbon-fluorine bond such as $CF_4$, $CH_4F_8$, $C_4F_{10}$, $C_2F_4$, or $C_4F_6$ are preferably used as the material of the plasma polymerization.

In the case in which the hole injection layer 40 is disposed between the light emitting layer 60 and the anode 12, for example, as shown in FIG. 1, the average thickness of the buffer layer 70 is preferably smaller than 60 Å in order for obtaining appropriate electrical conductivity in the stacking direction.

A part of the inorganic bank 13 protrudes from the organic bank 14 towards the anode 12, and is formed to cover a part of the anode 12. A part of the buffer layer 70 is formed so as to overlap the part of the inorganic bank 13. By adopting such a configuration, the light emitting layer 60 and the anode 12 can be prevented from contacting at the edge of the hole injection layer 40, thus the difference in luminance between the periphery section and the center section of the light emitting layer 60, namely the luminance unevenness, can be reduced.

Further, although the organic EL device of the first embodiment according to the invention shown in FIG. 1 has a structure in which a part of a film forming the hole injection layer 40 is inserted between a part of the buffer layer 70 and the part of the inorganic bank 13 overlapping a part of the anode 12 in the periphery of a film forming the light emitting layer 60, the inserted part of the film has a smaller thickness than the center section of the film, and further, the part of the buffer layer 70 is also provided above that section, thus the carrier concentration in the periphery of the film is eased, and accordingly, an advantage of longer operating life can be expected.

Regarding the advantage of the ease of the carrier concentration described above, the same advantage can be expected by, for example, replacing another functional layer configuring the organic EL element such an electron injection layer, an electron transport layer, a hole transport layer, or the light emitting layer with the hole injection layer 40 in the configuration shown in FIG. 1.

Light Emitting Layer

As a material for forming the light emitting layer 60, a known light emitting material capable of emitting fluorescence or phosphorescence can appropriately be used. Further, in the present embodiment, the light emitting layers 60 are formed so that the emission wavelength bands thereof respectively correspond to the three primary colors of light in order for realizing full-color display. In other words, it is configured that the light emitting layer 60R with an emission wavelength band corresponding to red, the light emitting layer 60G with an emission wavelength band corresponding to green, and the light emitting layer 60B with an emission wavelength band corresponding to blue emit light with designated gray scale levels, respectively, thereby the organic EL device performs full-color display as a whole.

As a material for forming the light emitting layer 60, a known light emitting material capable of emitting fluorescence or phosphorescence can appropriately be used.

The material of the light emitting layer 60 is not particularly limited, but for example, (poly)fluorene derivatives (PF), (poly)para-phenylenevinylene derivatives (PPV), polyphenylene derivatives (PP), poly-para-phenylene derivatives (PPP), polyvinylcarbazole (PVK), polythiophene derivatives, or polysilane-based materials such as polymethylphenylsilane (PMPS) can preferably be used. Further, the above polymeric materials can be used with polymeric materials such as perylene dye, coumarin dye, or rhodamine dye, or with small molecular materials such as rubrene, perylene, 9,10-diphenylanthracene, tetraphenyl butadiene, nile red, coumarin 6, quinacridone, or $Ir(ppy)_3$ doped thereto.

Note here that "polymer" denotes polymerized substance having a molecular weight larger than so-called "small molecular" having a molecular weight of about several hundred, and the polymeric materials mentioned above include, in addition to generally-called polymers which are polymerized substances having molecular weights of no less than 10000, oligomeric substances called oligomer having molecular weights of no larger than 10000.

Note also that in the present embodiment, MEHPPV (poly (3-methoxy 6-(3-ethylhexyl)para-phenylenevinylene) is used as the material for forming the red light emitting layer 60R, a mixed solution of polydioctylfluorene and F8BT (alternating copolymer of dioctylfluorene and benzothiadiazole) is used as the material for forming the green light emitting layer 60G, and polydioctylfluorene is used as the material for forming the blue light emitting layer 60B. Further, the thickness of each of these light emitting layers 60R, 60G and 60B is appropriately determined in consideration of life, luminance, color and so on. It is determined here in a range of 60 through 120 nm in consideration of the drive voltage.

Cathode

The cathode 50 is appropriately selected in consideration of stability of the cathode, the work function, or the optical transmission factor. In this case, Ca (calcium) appropriate to the material used for the light emitting layer described above. Since the work function is as small as 2.9 eV, electron injection to the light emitting layer can preferably be performed. However, since Ca is easily oxidized and is poor in stability, the surface of the Ca layer is covered with Al (aluminum) as a supplement to electrical conductivity. Further, LiF (lithium fluoride) is provided in the boundary between the Ca layer and the light emitting layer in order for improving the optical characteristics. Regarding the thickness of the common cathode 50, LiF of 2 nm, Ca of 20 nm, and Al of 200 nm are adopted in the present embodiment. Further, particularly in the case of forming the top emission type of organic EL device, it is possible to form the auxiliary cathode 50 with a thickness thin enough for having transparency, or to form the cathode 50 using a transparent electrically conductive material such as ITO.

Method of Manufacturing Organic EL Device

An example of a method of manufacturing the organic EL device of the first embodiment according to the invention described above will now be explained along the process with reference to views of the cross-sectional structure shown in FIGS. 2A through 2E.

Formation of Hole Injection Layer

Figure 2A:
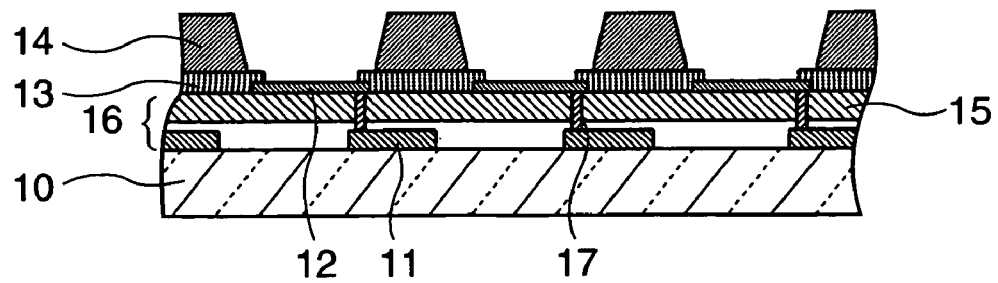
FIGS. 2A through 2E are cross-sectional views for explaining a process of manufacturing the organic EL device shown in FIG. 1.

FIG. 2A shows a cross-sectional view of a part of a base member including the anodes 12, the thin film transistors (TFTs) 11 and so on. Prior to applying the hole injection layer by an inkjet process, the inorganic bank 13 and the organic bank 14 are respectively provided with lyophilicity and lyophobicity with the ink by a plasma process. Regarding the conditions of the plasma process, it is performed under atmospheric pressure, power of 300 W, an electrode-substrate distance of 1 mm, further in the oxygen plasma process, an oxygen gas flow rate of 100 ml/minute, a helium gas flow rate of 10 l/minute, and a table transport speed of 10 mm/second, and subsequently in the $CF_4$ plasma process, a $CF_4$ gas flow rate of 100 ml/minute, a helium gas flow rate of 10 l/minute, and a table transport speed of 3 mm/second back and forth.

Figure 2B:
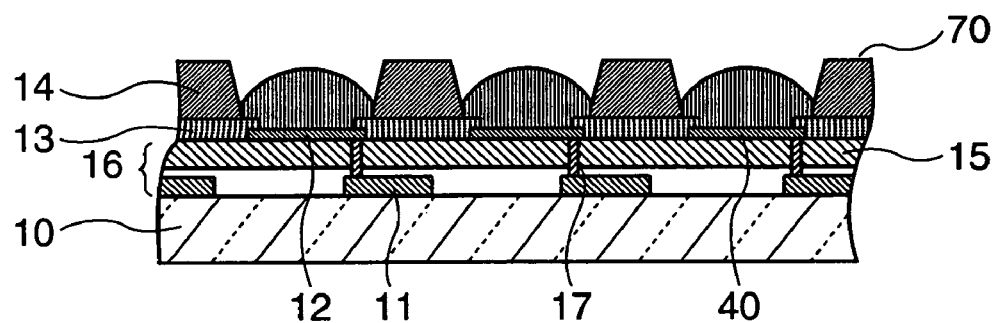

In FIG. 2B, PEDOT/PSS is used as the material of the hole injection layer 40, and dispersed with polar solvents of isopropyl alcohol, N-methylpyrrolidone, 1,3-dimethyl-2-imidazolidinone to prepare an ink composition, and the ink composition is ejected and applied by the inkjet method.

Subsequently, the solvents contained in the ink composition are removed in the conditions of in vacuo (1 torr (133.3 Pa)), at room temperature, and for 20 minutes, and then a thermal treatment is executed in nitrogen atmosphere at 200° C. (on a hot plate) for 10 minutes. The hole injection layer 40 with a constant thickness is formed by the above method.

Formation of Buffer Layer

Figure 2C:
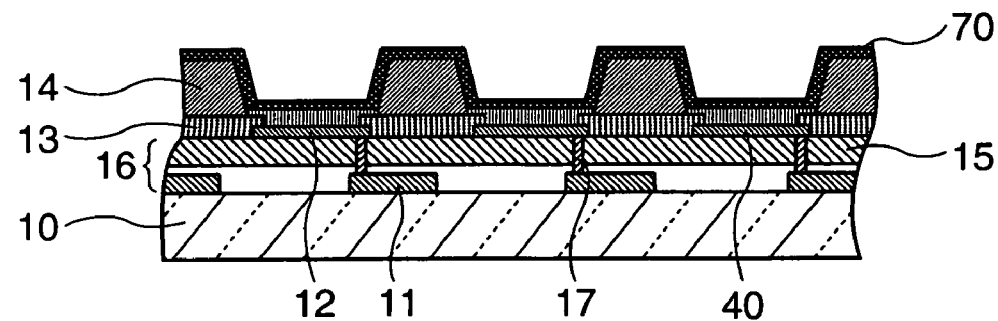

Subsequently, as shown in FIG. 2C, the buffer layer 70 is formed on the hole injection layer 40, in the buffer forming process, the plasma polymerization method using a gaseous material as a basic ingredient is used. In this embodiment, $CHF_3$ is used as the basic ingredient used for the plasma polymerization method.

Firstly, the inside of the chamber is depressurized to $9 \times 10^{-5}$ Torr. And then, in the conditions of the gas flow rate of 50 sccm, the gas pressure of 0.2 Torr, the plasma discharge frequency of 13.56 MHz, and the discharge power of 25 W, the polymer film is formed at a rate of about 80 Å/minute.

Formation of Light Emitting Layer

Figure 2D:
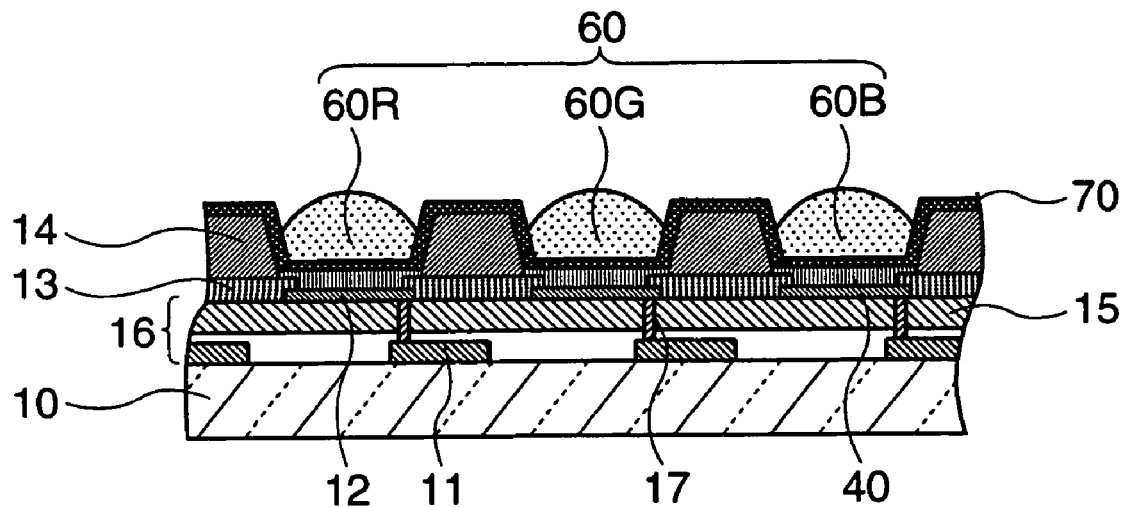

Subsequently, as shown in FIG. 2D, the light emitting layer 60 is formed in the light emitting layer forming process. In the light emitting layer forming process, the inkjet method, which is a droplet ejection method, is preferably adopted. In other words, the light emitting layer forming material is ejected on the anode buffer layer 70 by the inkjet method, and then a drying process and a thermal treatment are executed, thereby forming the light emitting layer 60. In forming the light emitting layer 60, coating is selectively executed on areas of the buffer layer corresponding to respective pixels of red, green, and blue using the inkjet method. Note that in the inkjet method, by optimizing the ejection amount, the number of ejection and so on, it is possible to appropriately adjust the film characteristics of the light emitting layers 60R, 60G, and 60B to the desired ones respectively.

Formation of Cathode

Figure 2E:
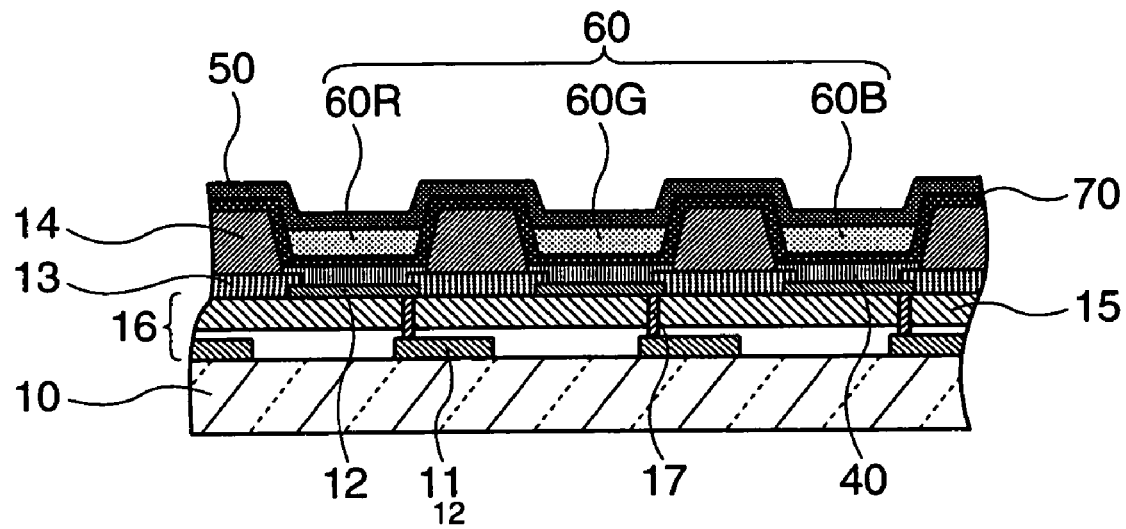

Subsequently, as shown in FIG. 2E, the cathode 50 is formed. Here, the cathode 50 is formed by stacking layers of LiF, Ca and Al. The cathode 50 is formed using a vacuum evaporation method.

After then, the upper surface of the cathode 50 is entirely covered with an epoxy resin adhesive as a sealing, thus the organic EL device according to the present embodiment is completed.

Organic EL Device of Second Embodiment According to the Invention

Figure 3:
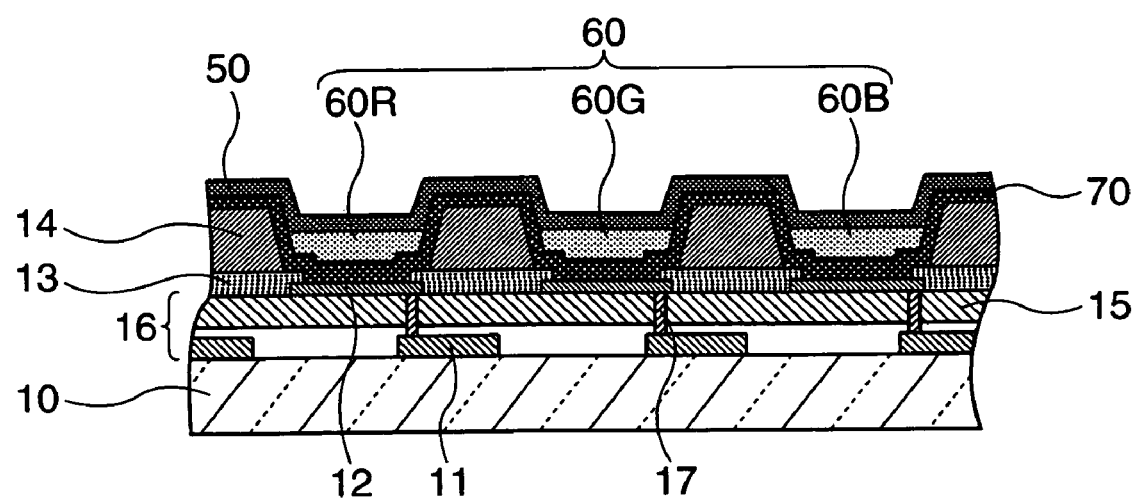
FIG. 3 is a cross-sectional view for explaining an organic EL device of a second embodiment according to the invention.

FIG. 3 shows a cross-sectional view of the organic EL device of the second embodiment according to the invention.

A major difference between the organic EL device of the first embodiment described above and the organic EL device of the second embodiment is that in the organic EL device of the first embodiment the buffer layer 70 is disposed between the light emitting layer 60 and the hole injection layer 40 above the anode 12 on the one hand, in the organic EL device of the second embodiment the buffer layer 70 is contiguous with both the anode 12 and the light emitting layer 60 on the other hand. Regarding other configuration elements than the above, the configuration materials, the basic ingredients, the process conditions and so on mentioned in the explanation of the organic EL device of the first embodiment described above can be adopted.

The thickness of the buffer layer 70 in the organic EL device of the second embodiment according to the invention shown in FIG. 3 can be made greater than the thickness of the buffer layer 70 in the organic EL device of the first embodiment shown in FIG. 1 because the anode 12 is contiguous with the buffer layer 70.

Specifically, the thickness of the buffer layer 70 in the organic EL device of the second embodiment can be about 200 Å in order for obtaining appropriate electrical conductivity in the stacking direction of the organic EL element.

In the case in which an average asperity (Ra) of the surface of the anode is equal to or greater than 15 Å, if the average thickness of the buffer layer 70 is greater than 15 Å and smaller than 200 Å, then the anode 12 can be prevented from directly contacting the light emitting layer 60, and improvement of the organic EL element in driving stability and reduction of luminance difference depending on the positions of the film forming the light emitting layer 60 can be expected.

Further, a part of the inorganic bank 13 protrudes from the organic bank 14 towards the anode 12, and is formed to cover a part of the anode 12. A part of the buffer layer 70 is formed so as to overlap the part of the inorganic bank 13. By adopting such a configuration, the light emitting layer 60 and the anode 12 can be prevented from contacting at the edge of the anode 12, thus the difference in luminance between the periphery section and the center section of the light emitting layer 60, namely the luminance unevenness, can be reduced.

A major difference of the manufacturing method of the organic EL device of the second embodiment according to the invention from the manufacturing method of the organic EL device shown in FIGS. 2A through 2E is that the buffer layer 70 is formed directly on the anode 12.

Specifically, the adhesiveness between the anode 12 and the buffer layer 70 is improved by executing the oxygen plasma on the surface of the anode 12. Subsequently, the buffer layer 70 is formed by executing the plasma polymerization using the basic ingredient for forming the buffer layer 70 described with regard to the manufacturing method shown in FIGS. 2A through 2E.

In other steps of the process, the configuration materials, the basic ingredients, the process conditions and so on mentioned with regard to the manufacturing method of the organic EL device shown in FIGS. 2A through 2E can be adopted.

Electronic Instrument

Figure 4:
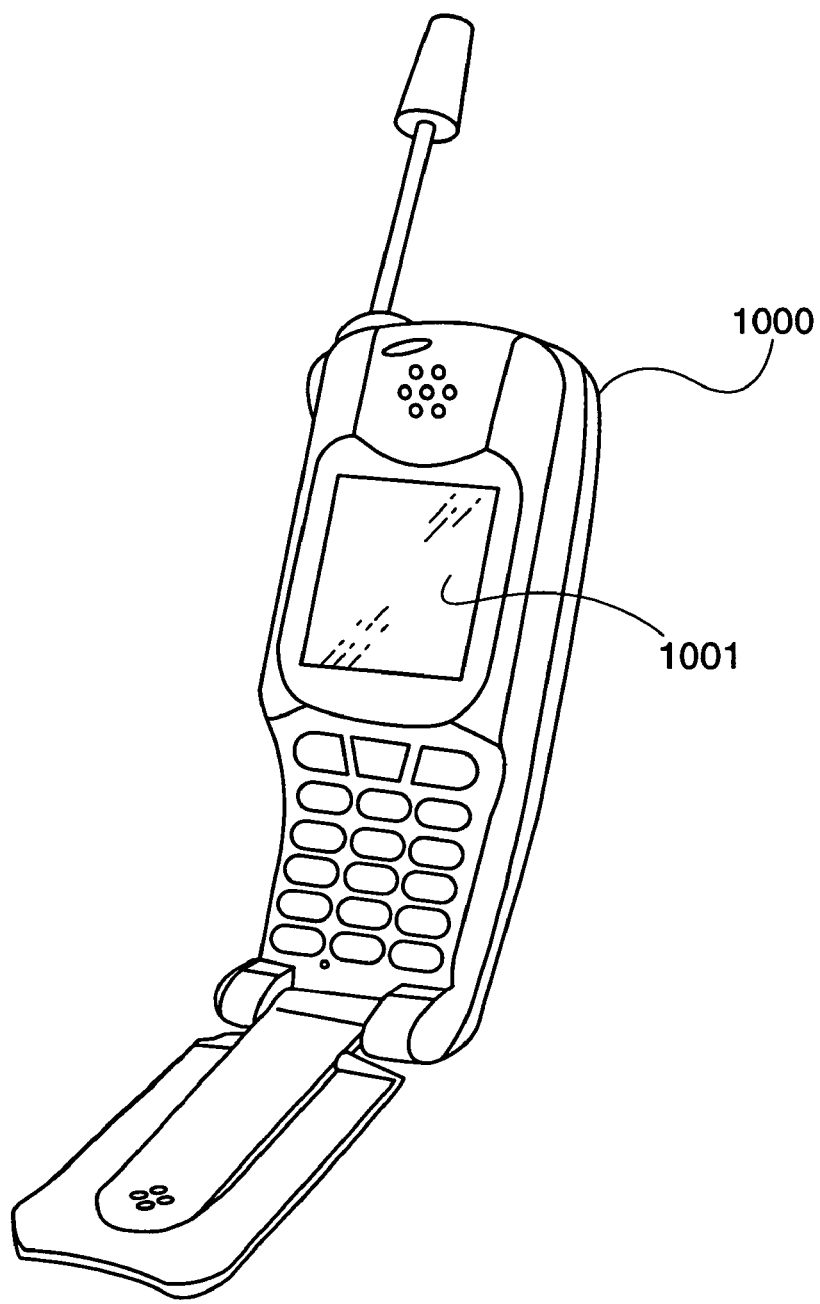
FIG. 4 is a perspective view of a cellular phone equipped with the organic EL device of the present embodiment.

An electronic instrument according to the invention will hereinafter be described with reference to FIG. 4. FIG. 4 is a perspective view of a cellular phone equipped with the organic EL device of the present embodiment. In FIG. 3, the reference numeral 1000 denotes a main body of the cellular phone, and the reference numeral 1001 denotes a display section. Since the cellular phone 1000, which is equipped with the display section 1001 composed of the organic EL device of the present embodiment, can exert preferable display characteristics.

Note that the present invention is not limited to the embodiments described above, but can be modified in various manners in practical use within a scope or spirit of the present invention.

SPECIFIC EXAMPLES

Some specific examples according to the invention will hereinafter be described.

First Specific Example

The pixel electrodes made of ITO were formed on the upper surface of the glass substrate, and then PEDOT/PSS film was formed on the upper surface thereof with a thickness of 600 Å as the hole injection layer using a coating method.

Further on the upper surface thereof, a polymer film of 30 Å thick was formed as the buffer layer using $CHF_3$ gas in the conditions of the gas flow rate of 50 sccm, the gas pressure of 0.2 Torr, the plasma discharge frequency of 13.56 MHz, and the discharge power of 25 W.

The light emitting layer was formed on the upper surface thereof using a mixed solution of polydioctylfluorene and F8BT (alternating copolymer of dioctylfluorene and benzothiadiazole).

On the upper surface of the light emitting layer, 40 Å of LiF film, 50 Å of Ca film, and 2000 Å of Al film composing the cathode were formed by the vacuum evaporation method.

After then, the whole body was sealed with a sealing substrate.

Figure 5:
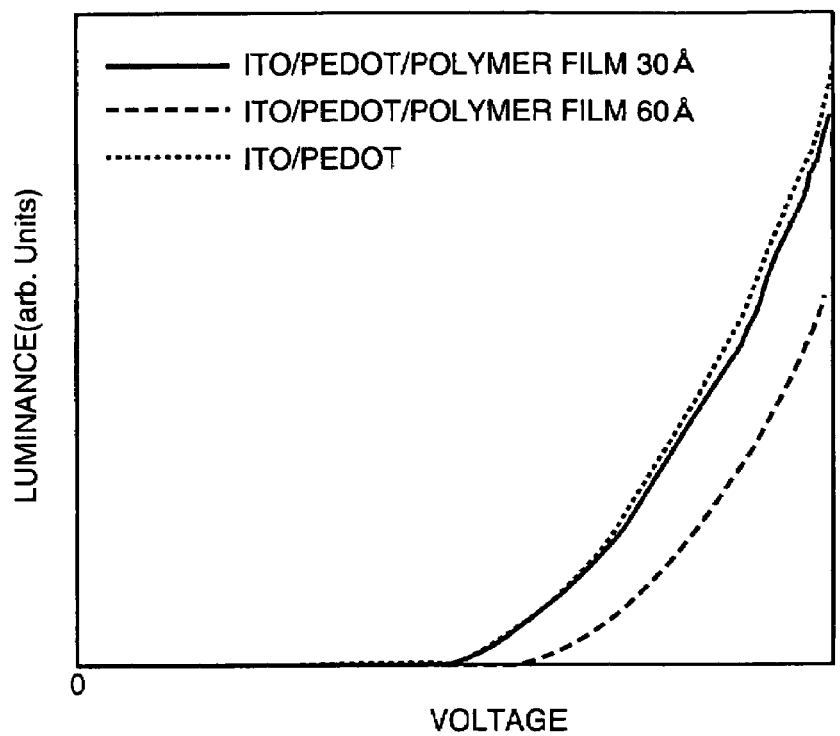
FIG. 5 is a chart showing luminance-voltage characteristics in the first embodiment, the second embodiment, and a first comparative example.
Figure 6:
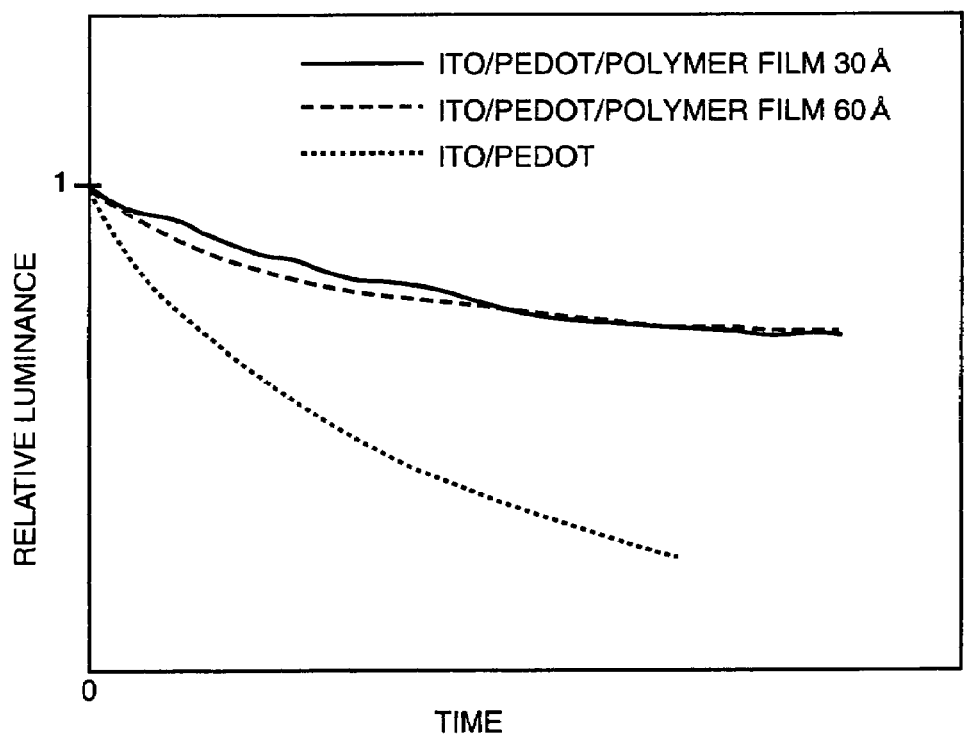
FIG. 6 is a chart showing changes in luminance with respect to time in the first embodiment, the second embodiment, and the first comparative example.
Figure 7:
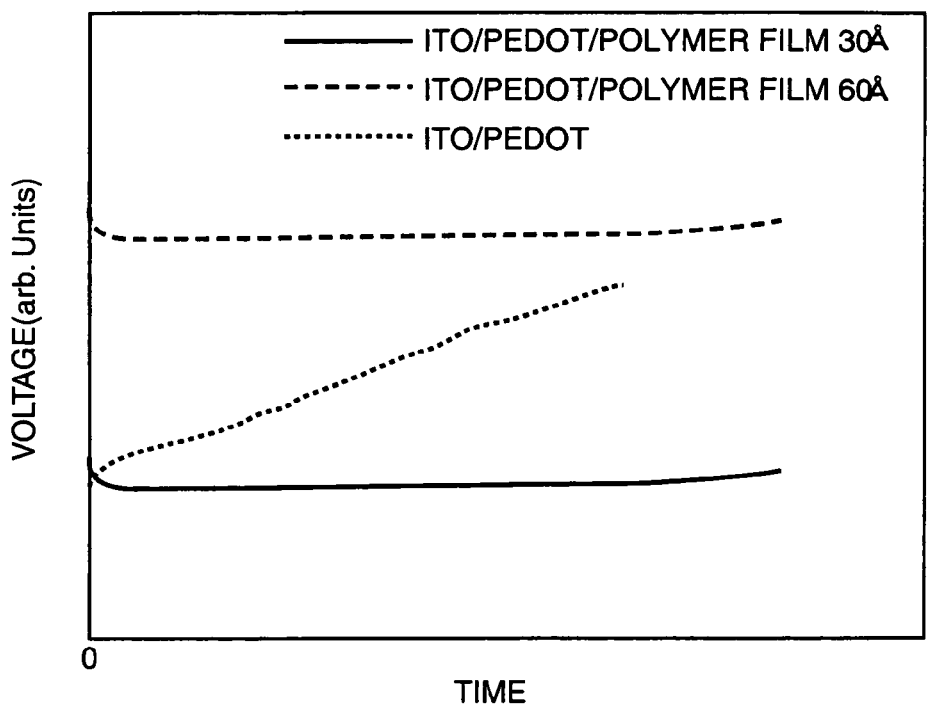
FIG. 7 is a chart showing changes in voltages with respect to time in the first embodiment, the second embodiment, and the first comparative example.

In the organic EL device thus formed, the luminance of light emitted from the light emitting layer and the electrical current were measured while applying direct current voltage between the anode and the cathode. The solid line in FIG. 5 shows luminance-voltage characteristics. And, the solid line in FIG. 6 shows a change in the luminance with respect to time in the condition in which the current in accordance with a predetermined luminance is maintained constant. Further, the solid line in FIG. 7 shows a change in the voltage with respect to time. Note here that the relative luminance means the ratio of the luminance with respect to the initial luminance at a certain time point.

Second Specific Example

The pixel electrodes made of ITO were formed on the upper surface of the glass substrate, and then PEDOT/PSS film was formed on the upper surface thereof with a thickness of 600 Å as the hole injection layer using a coating method.

Further on the upper surface thereof, a polymer film of 60 Å thick was formed as the buffer layer using $CHF_3$ gas in the conditions of the gas flow rate of 50 sccm, the gas pressure of 0.2 Torr, the plasma discharge frequency of 13.56 MHz, and the discharge power of 25 W.

The light emitting layer was formed on the upper surface thereof using a mixed solution of polydioctylfluorene and F8BT (alternating copolymer of dioctylfluorene and benzothiadiazole).

On the upper surface of the light emitting layer, 40 Å of LiF film, 50 Å of Ca film, and 2000 Å of Al film composing the cathode were formed by the vacuum evaporation method.

After then, the whole body was sealed with the sealing substrate.

In the organic EL device thus formed, the luminance of light emitted from the light emitting layer and the electrical current were measured while applying direct current voltage between the anode and the cathode. The broken line in FIG. 5 shows luminance-voltage characteristics. And, the broken line in FIG. 6 shows a change in the luminance with respect to time in the condition in which the current in accordance with a predetermined luminance is maintained constant similarly to the first specific example. Further, the broken line in FIG. 7 shows a change in the voltage with respect to time.

First Comparative Example

The pixel electrodes made of ITO were formed on the upper surface of the glass substrate, and then PEDOT/PSS film was formed on the upper surface thereof with a thickness of 600 Å as the hole injection layer using a coating method.

The light emitting layer was formed on the upper surface thereof using a mixed solution of polydioctylfluorene and F8BT (alternating copolymer of dioctylfluorene and benzothiadiazole).

On the upper surface of the light emitting layer, 40 Å of LiF film, 50 Å of Ca film, and 2000 Å of Al film composing the cathode were formed by the vacuum evaporation method.

After then, the whole body was sealed with the sealing substrate.

In the organic EL device thus formed, the luminance of light emitted from the light emitting layer and the electrical current were measured while applying direct current voltage between the anode and the cathode. The dotted line in FIG. 5 shows luminance-voltage characteristics. And, the dotted line in FIG. 6 shows a change in the luminance with respect to time in the condition in which the current in accordance with a predetermined luminance is maintained constant similarly to the first specific example. Further, the dotted line in FIG. 7 shows a change in the voltage with respect to time.

Third Specific Example

Adjustment of Buffer Layer

The buffer layer was prepared using a glass substrate. An oxygen plasma process was executed on the surface of the glass substrate. And then, the buffer layer was formed thereon. The buffer layer was formed using the plasma polymerization method. The polymer film was formed inside a chamber implementing a parallel plate reactor using a $CHF_3$ gas. Firstly, the inside of the chamber was depressurized to $9 \times 10^{-5}$ Torr. And then, in the conditions of the gas flow rate of 50 sccm, the gas pressure of 0.2 Torr, the plasma discharge frequency of 13.56 MHz, and the discharge power of 25 W, the polymer film was formed at a rate of about 80 Å/minute.

As a result of the analysis of the polymer film thus formed using XPS (X-ray photoelectron spectroscopy), no spectrum caused by an impurity was detected from the C1s spectrum, but spectrums derived from $CF_3$, $CF_2$, CF, C—CF, CH were detected therefrom.

Subsequently, the polymer film was formed on the ITO substrate. The ITO substrate here is a substrate obtained by forming the anode made of ITO on the upper surface of a glass substrate. An oxygen plasma process was executed on the surface of this substrate. The surface conditions of the polymer films formed on the surface of the ITO with thickness of 10 Å, 100 Å, and 500 Å, respectively, and the ITO with no polymer films formed thereon were observed using an AFM. As a result, the average surface asperity (Ra) of the ITO surface was 17.5 Å, the Ra values of those with the polymer films formed thereon with thickness of 10 Å, 100 Å, and 500 Å were 17.4 Å, 16.5 Å, and 13.1 Å, respectively. Although the Ra value hardly changed in the case of the polymer film of 10 Å from the Ra value of the ITO surface, the Ra value decreased in accordance with the thickness thereof increasing to 100 Å, and then 500 Å.

Electrical Conductivity of Buffer Layer

Polymer films of 100 Å thick and 500 Å thick using the $CHF_3$ gas were formed on the ITO substrate by the same method as described above. Al of 2000 Å thick was formed thereon by the vacuum evaporation method.

In the element thus formed, a direct current voltage was applied between the anode and the cathode. The value of the current flowing through the element at that time was measured.

In the case with the polymer film as thick as 500 Å, the current value was equal to or less than $1\times10^{-5}$ mA/cm$^2$ in converting into the current density in accordance with application of 4V voltage, which was smaller than the measuring limit of the measuring equipment. Meanwhile, in the case with the polymer film of 100 Å thick, the current density in accordance with application of 4V voltage was $1.5\times10^2$ mA/cm$^2$.

The polymer film of 100 Å thick using the CHF$_3$ gas was formed on the ITO substrate by the same method as described above.

The light emitting layer was formed on the upper surface thereof using a mixed solution of polydioctylfluorene and F8BT (alternating copolymer of dioctylfluorene and benzothiadiazole).

On the upper surface of the light emitting layer, 40 Å of LiF film, 50 Å of Ca film, and 2000 Å of Al film composing the cathode were formed by the vacuum evaporation method.

Figure 8:
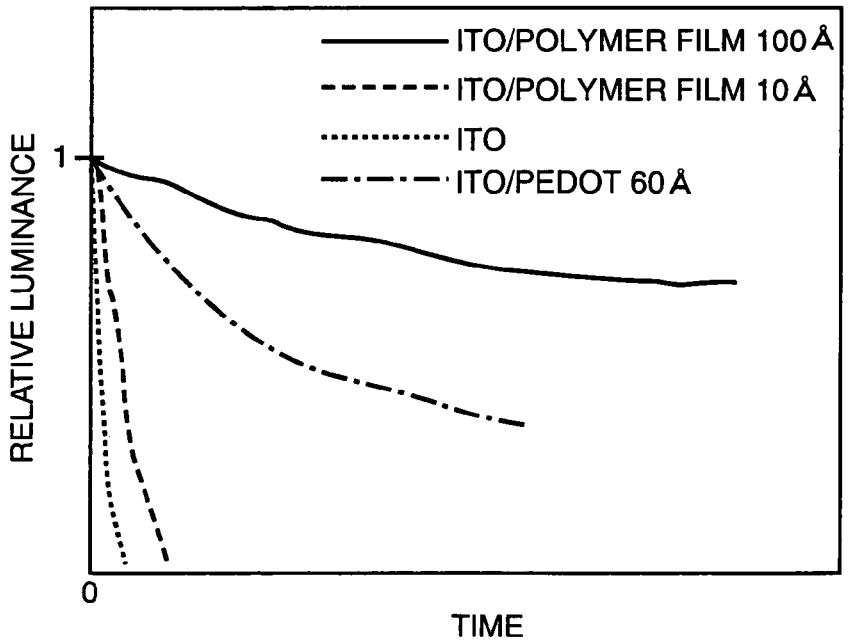
FIG. 8 is a chart showing changes in luminance with respect to time in a third embodiment, a fourth embodiment, a second comparative example, and a third comparative example.
Figure 9:
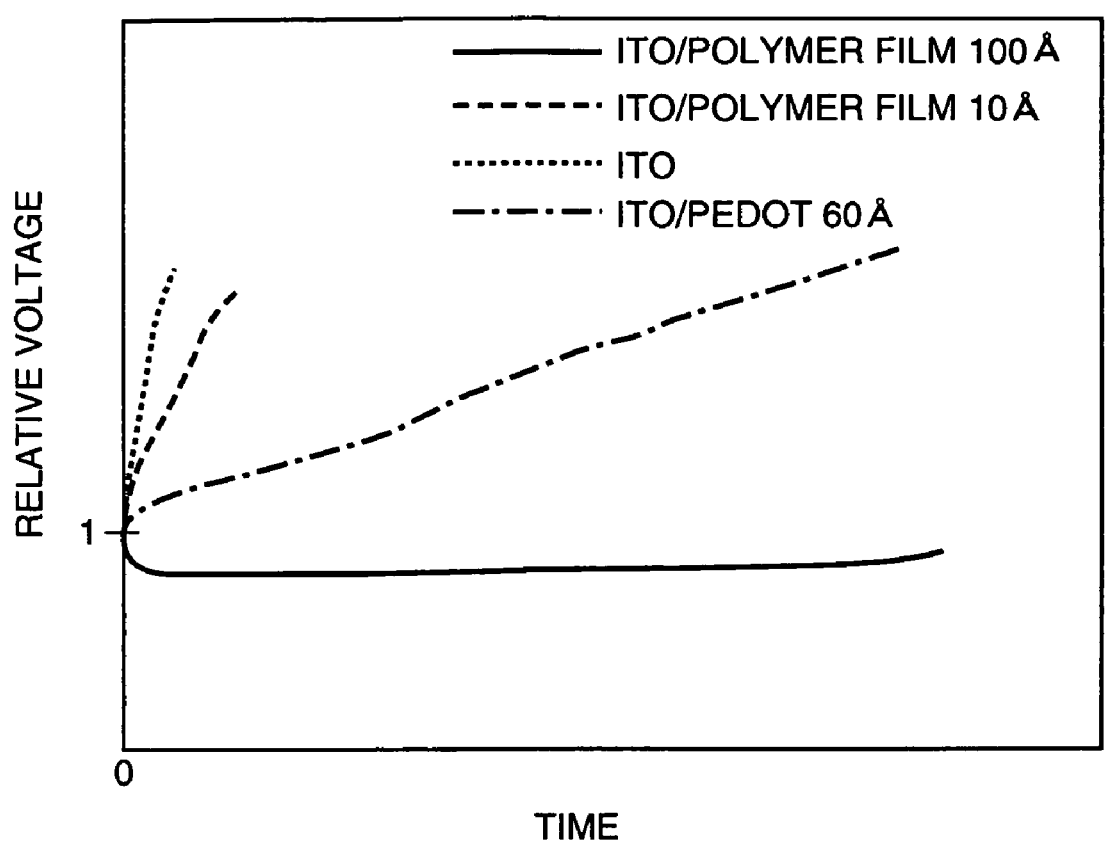
FIG. 9 is a chart showing changes in voltages with respect to time in the third embodiment, the fourth embodiment, the second comparative example, and the third comparative example.

After then, the whole body was sealed with the sealing substrate. In the organic EL device thus formed, the luminance of light emitted from the light emitting layer and the electrical current were measured while applying direct current voltage between the anode and the cathode. The solid line in FIG. 8 shows a change in the luminance with respect to time in the condition in which the current in accordance with a predetermined luminance is maintained constant. Further, the solid line in FIG. 9 shows a change in the voltage with respect to time. Note here that the relative luminance means the ratio of the luminance with respect to the initial luminance at a certain time point, and the relative voltage means the ratio of the voltage with respect to the initial luminance at a certain time point.

Fourth Specific Example

The polymer film of 10 Å thick using the CHF$_3$ gas was formed on the ITO substrate similarly to the case with the third specific example.

The layers before the light emitting layer were formed similarly to the case with the third specific example.

The light emitting layer was formed on the upper surface thereof using a mixed solution of polydioctylfluorene and F8BT (alternating copolymer of dioctylfluorene and benzothiadiazole).

On the upper surface of the light emitting layer, 200 Å of Ca film, and 2000 Å of Al film composing the cathode were formed by the vacuum evaporation method.

After then, the whole body was sealed with the sealing substrate.

In the organic EL device thus formed, the luminance of light emitted from the light emitting layer and the electrical current were measured while applying direct current voltage between the anode and the cathode. The broken line in FIG. 8 shows a change in the luminance with respect to time in the condition in which the current in accordance with a predetermined luminance is maintained constant similarly to the first specific example. Further, the broken line in FIG. 9 shows a change in the voltage with respect to time.

Second Comparative Example

The oxygen plasma process was executed on the surface of the ITO substrate.

The light emitting layer was formed on the upper surface thereof using a mixed solution of polydioctylfluorene and F8BT (alternating copolymer of dioctylfluorene and benzothiadiazole).

On the upper surface of the light emitting layer, 40 Å of LiF film, 50 Å of Ca film, and 2000 Å of Al film composing the cathode were formed by the vacuum evaporation method.

After then, the whole body was sealed with the sealing substrate.

In the organic EL device thus formed, the luminance of light emitted from the light emitting layer and the electrical current were measured while applying direct current voltage between the anode and the cathode. The dotted line in FIG. 8 shows a change in the luminance with respect to time in the condition in which the current in accordance with a predetermined luminance is maintained constant similarly to the first specific example. Further, the dotted line in FIG. 9 shows a change in the voltage with respect to time.

Third Comparative Example

The oxygen plasma process was executed on the surface of the ITO substrate. The dispersion liquid of PEDOT/PSS (Product mane: Bytron-p, produced by Bayer Material Science AG) was applied thereon by the coating method to form 600 Å thick film.

The light emitting layer was formed on the upper surface thereof using a mixed solution of polydioctylfluorene and F8BT (alternating copolymer of dioctylfluorene and benzothiadiazole).

On the upper surface of the light emitting layer, 40 Å of LiF film, 50 Å of Ca film, and 2000 Å of Al film composing the cathode were formed by the vacuum evaporation method.

After then, the whole body was sealed with the sealing substrate.

In the organic EL device thus formed, the luminance of light emitted from the light emitting layer and the electrical current were measured while applying direct current voltage between the anode and the cathode. The dash-dotted line in FIG. 8 shows a change in the luminance with respect to time in the condition in which the current in accordance with a predetermined luminance is maintained constant similarly to the first specific example. Further, the dash-dotted line in FIG. 9 shows a change in the voltage with respect to time.

What is claimed is:

1. A method of manufacturing an organic EL device provided at least with a light emitting layer between a first electrode and a second electrode disposed above a base member, comprising:
    forming a bank for partitioning the light emitting layer;
    forming a hole injection layer on the first electrode;
    forming a buffer layer above the hole injection layer, the buffer layer being formed by using a plasma polymerization method, the buffer layer entirely covering the bank to suppress the degradation of the light emitting layer;
    forming the light emitting layer above the buffer layer by an inkjet method; and
    forming the second electrode covering the buffer layer and the light emitting layer.

2. The method of manufacturing an organic EL device according to claim 1, the buffer layer including fluorine.

3. The method of manufacturing an organic EL device according to claim 1, the buffer layer including fluorocarbon.

4. The method of manufacturing an organic EL device according to claim 1,
    the hole injection layer being in contact with the buffer layer.

5. The method of manufacturing an organic EL device according to claim 1,
the hole injection layer containing a polymer material including ethylenedioxythiophene.

6. The method of manufacturing an organic EL device according to claim 1,
in the forming of the buffer layer, the buffer layer being formed so as to be in contact with the first electrode, and
an average thickness of the buffer layer being greater than 15 Å and smaller than 200 Å providing average asperity (Ra) of a surface of the first electrode being equal to or greater than 15 Å.

7. The method of manufacturing an organic EL device according to claim 1,
an average thickness of the buffer layer being equal to or less than 200 Å.

8. The method of manufacturing an organic EL device according to claim 1,
an average thickness of the buffer layer being equal to or less than 60 Å.

9. The method of manufacturing an organic EL device according to claim 1,
the buffer layer entirely covering the hole injection layer.

10. The method of manufacturing an organic EL device according to claim 1,
the bank having a first film and a second film,
the first film covering a part of the first electrode,
the hole injection layer covering a part of the first film, and
the buffer layer covering at least a part of the first film and the second film.

11. The method of manufacturing an organic EL device according to claim 10,
the first film being made of an inorganic material.

12. The method of manufacturing an organic EL device according to claim 1, further comprising:
forming a plurality of banks for partitioning the light emitting layers, the first electrode being disposed between two of the plurality of banks.

13. The method of manufacturing an organic EL device according to claim 1, the hole injection layer containing a PEDOT/PSS.

* * * * *